United States Patent
Kuo et al.

(10) Patent No.: US 8,644,781 B2
(45) Date of Patent: Feb. 4, 2014

(54) CLOCK GENERATOR WITH FREQUENCY ERROR COMPENSATION AND MOBILE DEVICE USING THE SAME

(75) Inventors: Chun-Ming Kuo, Hsinchu (TW); Song-Yu Yang, Chiayi (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/494,982

(22) Filed: Jun. 12, 2012

(65) Prior Publication Data
US 2013/0171953 A1    Jul. 4, 2013

Related U.S. Application Data

(60) Provisional application No. 61/582,717, filed on Jan. 3, 2012.

(51) Int. Cl.
*H04B 7/00* (2006.01)
(52) U.S. Cl.
USPC ........................... 455/255; 455/259; 455/318
(58) Field of Classification Search
USPC ............. 455/550.1, 574, 255, 256, 257, 259, 455/260, 264, 343.1, 315, 316, 317, 318; 375/362
See application file for complete search history.

(56) References Cited

U.S. PATENT DOCUMENTS

| 5,941,990 | A | 8/1999 | Hiiragizawa |
| 2007/0190964 | A1* | 8/2007 | Edwards et al. ........... 455/343.1 |
| 2008/0276113 | A1 | 11/2008 | Tabeta |
| 2010/0303185 | A1* | 12/2010 | Haartsen ...................... 375/362 |

OTHER PUBLICATIONS

Paper: Danielle Griffith, Fikret Dülger, Gennady Feygin, Ahmed Nader Mohieldin, and Prasanth Vallur, "A 65nm CMOS DCXO System for Generating 38.4MHz and a Real Time Clock from a Single Crystal in 0.09mm^ 2", IEEE RFIC Symposium 2010.

* cited by examiner

*Primary Examiner* — Thanh Le
(74) *Attorney, Agent, or Firm* — Winston Hsu; Scott Margo

(57) ABSTRACT

A clock generator for a mobile device, capable of operating in one of a full-power mode and a low-power mode according to a standby signal to generate a high-frequency clock signal and a low-frequency clock signal is disclosed. The clock generator includes a crystal oscillator, for generating an oscillation signal of a specific frequency according to the power mode of the clock generator; a frequency division block, for dividing the oscillation signal by a specific divisor according to the power mode of the clock generator to generate the low-frequency clock signal; and a buffer block, for amplifying the oscillation signal to generate the high-frequency clock signal; wherein during each power mode, a frequency of the low-frequency clock signal is substantially the same.

20 Claims, 5 Drawing Sheets

CLOCK GENERATOR WITH FREQUENCY ERROR COMPENSATION AND MOBILE DEVICE USING THE SAME

CROSS REFERENCE TO RELATED APPLICATIONS

This application claims the benefit of U.S. Provisional Application No. 61/582,717, which was filed on 2012 Jan. 3 and is included herein by reference.

BACKGROUND

The present invention relates to a clock generator and a mobile communications device using the same, and more particularly, to a single-crystal clock generator capable of operating in different power modes to generate different frequency clock signals, and a mobile communications device using the same.

With the development of electronic technologies, a mobile communications device may be equipped with more than one wireless communications service, such as GSM/GPRS/EG-PRS (GGE), Bluetooth, Wireless Fidelity (Wi-Fi), Worldwide Interoperability for Microwave Access (WiMAX) wireless communications service, Long Term Evolution (LTE) wireless communications service, and so on. A modern mobile electronic device may contain many wireless communications blocks to provide communications services corresponding to different wireless communications standards, respectively. In addition, for reducing the production cost, all the wireless communications blocks of the mobile electronic device may share a single reference oscillator, since the cost of a precise oscillator (e.g. a crystal oscillator) is very high.

Generally, a mobile communications device requires multiple external crystal oscillators to provide reference clocks for different functional blocks of the device. For example, a transceiver chip of the communications device may require an external high-frequency (e.g. 26 MHz) crystal with high performance specifications to provide a reference clock for radio frequency (RF) signal generation or modulation/demodulation operations for various communications services such as GSM/GPRS/EGPRS (GGE), Bluetooth, Wireless Fidelity (Wi-Fi), Worldwide Interoperability for Microwave Access (WiMAX), Long Term Evolution (LTE), and so on. Additionally, the mobile device may require another low-frequency (e.g. 32 KHz) crystal for providing a reference clock during mobile communications standby (e.g. Real-time clock, RTC) or during battery-off (when the battery is removed from the device).

However, the cost of crystal oscillators is prohibitively high. For example, for a mobile communications chip with a production cost of around 1-2 USD, the high-frequency crystal (e.g. costs around 0.1 USD) and the low-frequency crystal (e.g. costs around 0.15 USD) together may account for up to 20% of the production cost of the whole chip. Also, the area of printed circuit board (PCB) required by the device would also be increased due to the use of multiple oscillators.

Therefore, it has become a common goal of the industry to provide a way of clock generation for mobile communications devices while reducing chip cost and circuit area.

SUMMARY

It is therefore an objective of the present invention to provide a single-crystal clock generator capable of operating in different power modes to generate different clock signals, and a mobile device using the same.

The present invention discloses a clock generator for a mobile device, capable of operating in one of a full-power mode and a low-power mode according to a standby signal to generate a high-frequency clock signal and a low-frequency clock signal, the clock generator including a crystal oscillator, for generating an oscillation signal of a specific frequency according to the power mode of the clock generator; a frequency division block, for dividing the oscillation signal by a specific divisor according to the power mode of the clock generator to generate the low-frequency clock signal; and a buffer block, for amplifying the oscillation signal to generate the high-frequency clock signal; wherein during each power mode, a frequency of the low-frequency clock signal is substantially the same.

The present invention further discloses a mobile device, including a clock generator, capable of operating in one of a full-power mode and a low-power mode according to a standby signal to generate a high-frequency clock signal and a low-frequency clock signal, the clock generator including a crystal oscillator, for generating an oscillation signal of a specific frequency according to the power mode of the clock generator; a frequency division block, for dividing the oscillation signal by a specific divisor according to the power mode of the clock generator to generate the low-frequency clock signal; and a buffer block, for amplifying the oscillation signal to generate the high-frequency clock signal; wherein during each power mode, a frequency of the low-frequency clock signal is substantially the same.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
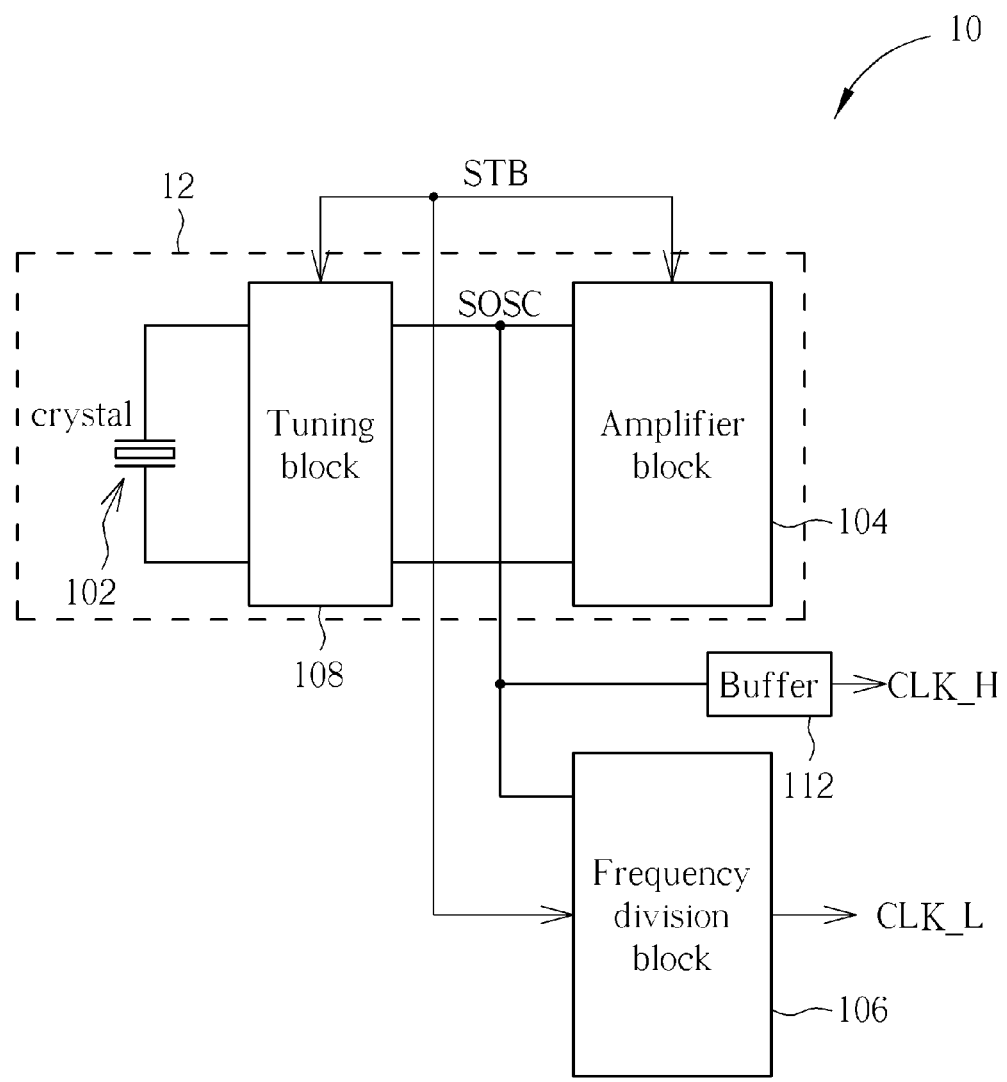
FIG. 1 is a schematic block diagram of a clock generator according to an embodiment of the present invention.

Please refer to FIG. 1, which is a schematic block diagram of a clock generator 10 according to an embodiment of the present invention. The clock generator 10 may be used in a mobile communications device, and can operate in different power modes to generate clock signals with different frequencies. The clock generator 10 includes a crystal oscillator 12, a buffer block 112 and a frequency division block 106. The crystal oscillator 12 includes a crystal 102, an amplifier block 104, and a tuning block 108. The tuning block 108 tunes the crystal 102 to generate an oscillation signal SOSC with a frequency corresponding to the power mode, which is then amplified by the buffer block 112 to generate a high frequency clock signal CLK_H. The amplifier block 104 drives the crystal 102 and cancels the loss of the crystal 102 to maintain the oscillation signal SOSC. The oscillation signal SOSC is also frequency-divided by the frequency division block 106 to generate a low-frequency clock signal CLK_L. In the prior art, a mobile device utilizes separate crystal oscillators to generate a high frequency clock signal for radio frequency (RF) transmission or a low-frequency clock signal for standby mode of the mobile device, respectively. In contrast, the clock generator 10 utilizes only one crystal 102, and operates in different power modes to generate different clock signals, thereby lowering the production costs and circuit area.

In more detail, the clock generator 10 can operate in a full-power mode FPM and a low-power mode LPM according to a standby signal STB. The crystal oscillator 12 may be a high-frequency (e.g. 26 MHz) digitally controlled crystal oscillator (DCXO) with high performance specifications. The tuning block 108 is connected to the crystal 102 in parallel, and can be used to adjust the frequency of the oscillation signal SOSC according to the power mode of the clock generator 10. The amplifier block 104 drives the crystal 102 to sustain the oscillation signal SOSC, wherein a power consumed by the amplifier block 104 depends on the power mode of the clock generator 10. Thus, the amplifier block 104 consumes different amounts of power as required in different power modes. The frequency division block 106 divides the oscillation signal SOSC by a specific divisor DIV according to the power mode to generate the low-frequency clock signal CLK_L. The CLK_H may be used in various wireless communications operations of the mobile device, such as radio frequency (RF) signal generation or modulation/demodulation operations for various communications services such as GSM/GPRS/EGPRS (GGE), Bluetooth, Wireless Fidelity (Wi-Fi), Worldwide Interoperability for Microwave Access (WiMAX), Long Term Evolution (LTE), and so on. The low-frequency clock signal CLK_L (e.g. 32 KHz) may be used as a reference clock during the standby mode (e.g. Real-time clock, RTC). Therefore, only one crystal is needed to generate the above different clock signals for the mobile device, thereby reducing production costs and circuit area.

Figure 2:
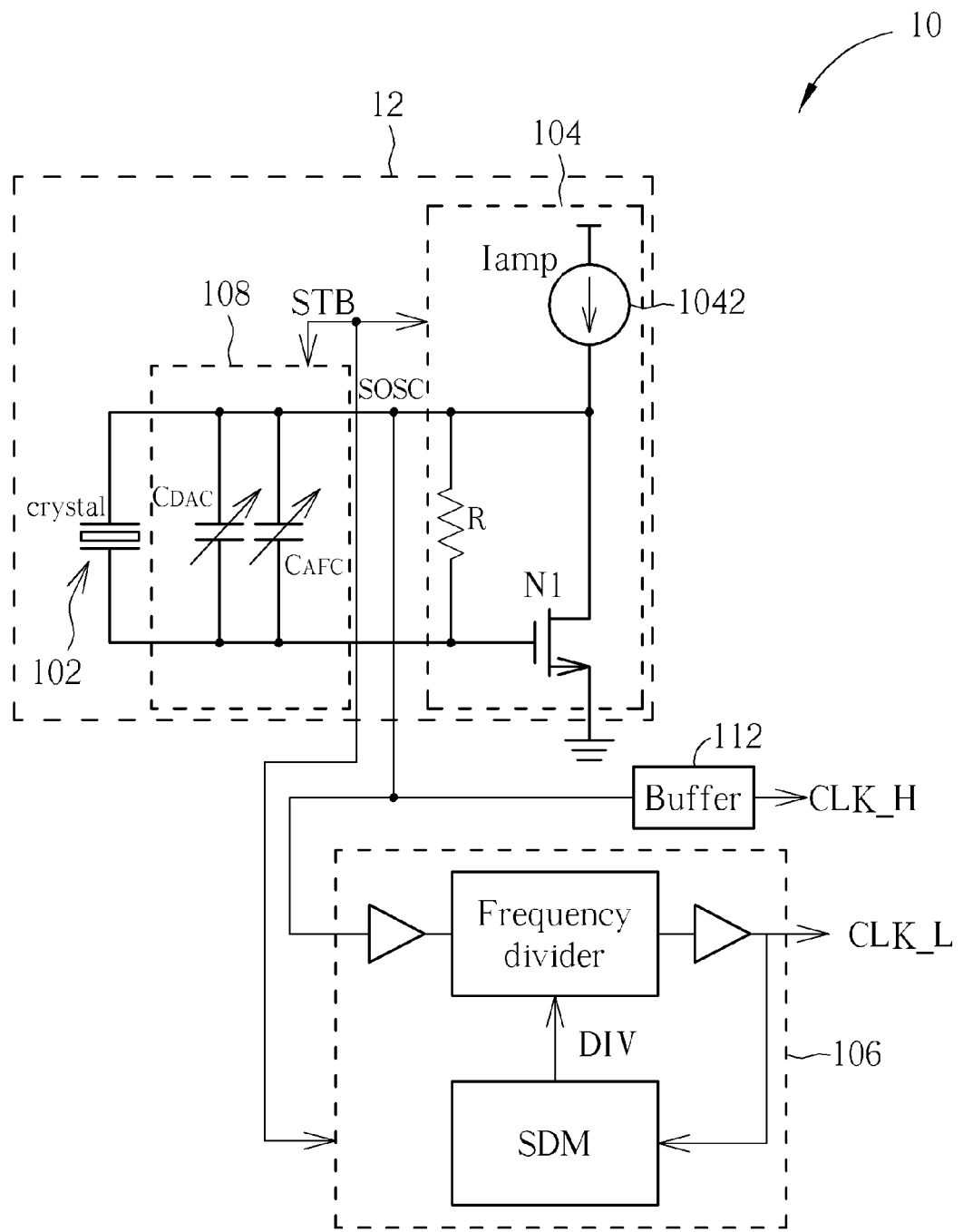
FIG. 2 is a schematic diagram of the details of the clock generator shown in FIG. 1 according to an embodiment of the present invention.

More specifically, please refer to FIG. 2, which is a schematic diagram of details of the clock generator 10. As shown in FIG. 2, the tuning block 108 is connected to the crystal 102 in parallel, and includes two variable capacitor arrays, $C_{DAC}$ and $C_{AFC}$, which may be tuned to adjust the oscillation frequency of the crystal 102 according to the power mode. The amplifier block 104 includes a current source 1042, a NMOS transistor N1 and a resistor R. The gate and drain terminals of the NMOS transistor N1 are coupled to the two terminals of the crystal 102. The resistor R is coupled between the gate and drain of the NMOS transistor N1 to provide bias. The NMOS transistor N1 has a specific transconductance value Gm corresponding to the power mode of the clock generator 10. The current source 1042 is used to provide sufficient energy for the NMOS transistor N1 to compensate the loss of the crystal 102 and sustain the oscillation signal SOSC, which in turn drives the buffer block 112 to generate the high frequency clock signal CLK_H. The frequency division block 106 is a divide-by-n frequency divider, and may preferably be a sigma-delta modulation (SDM) fractional-n divider, wherein n is the mean of the divisor DIV according to the power mode of the clock generator 10. Operations of the tuning block 108, the transconductance NMOS transistor N1, and the frequency division block 106 are well known to those skilled in the art, and are not detailed here.

Firstly, when the standby signal STB indicates the clock generator 10 to operate in the full-power mode FPM, the current source 1042 is set to higher current level and thus the transconductance Gm of the NMOS transistor N1 has a higher transconductance value Gm_FPM to provide sufficient power for radio frequency clock signal generation. The oscillation signal SOSC is then amplified to generate the high frequency clock signal CLK_H. At the same time, the frequency division block 106 performs frequency division on the oscillation signal SOSC by a divisor DIV_FPM to generate the low-frequency clock signal CLK_L. During the full power mode FPM, the high frequency clock signal CLK_H is used for active wireless communications of the mobile device, while the low frequency clock signal CLK_L is used to provide a clock signal to maintain standby status of other parts of the mobile device (e.g. Real Time Clock).

On the other hand, when the mobile device is in standby mode, the standby signal STB can indicate the clock generator 10 to operate in the low-power mode LPM, and the current source 1042 is set to lower current level and the transconductance value Gm of the NMOS transistor N1 has a lower value Gm_LPM, since high performance clock signal generation is not required. In this case, the amplifier block 104 consumes much less power and lower current (e.g. 100 uA) during the low-power mode LPM. At the same time, the frequency division block 106 performs frequency division on the oscillation signal SOSC by a divisor DIV_LPM to generate the low-frequency clock signal CLK_L, for providing mobile communications standby clock signal of the mobile device (e.g. Real Time Clock).

It should be noted that the low-frequency clock signal CLK_L needs to be generated at all times (during the high-power mode FPM and the low-power mode LPM alike), and it is crucial that low-frequency clock signal CLK_L is kept at the same frequency at all times, since the real-time clock is used to coordinate the mobile device be activated from standby mode to receive paging and other crucial communications operations. However, it is possible that when the transconductance value Gm of the NMOS transistor N1 is lowered during the low-power mode LPM, frequency deviations or errors may occur in the frequency of the low-frequency clock signal CLK_L. Thus, some sort of frequency compensation is required for the clock generator 10.

Figure 3:
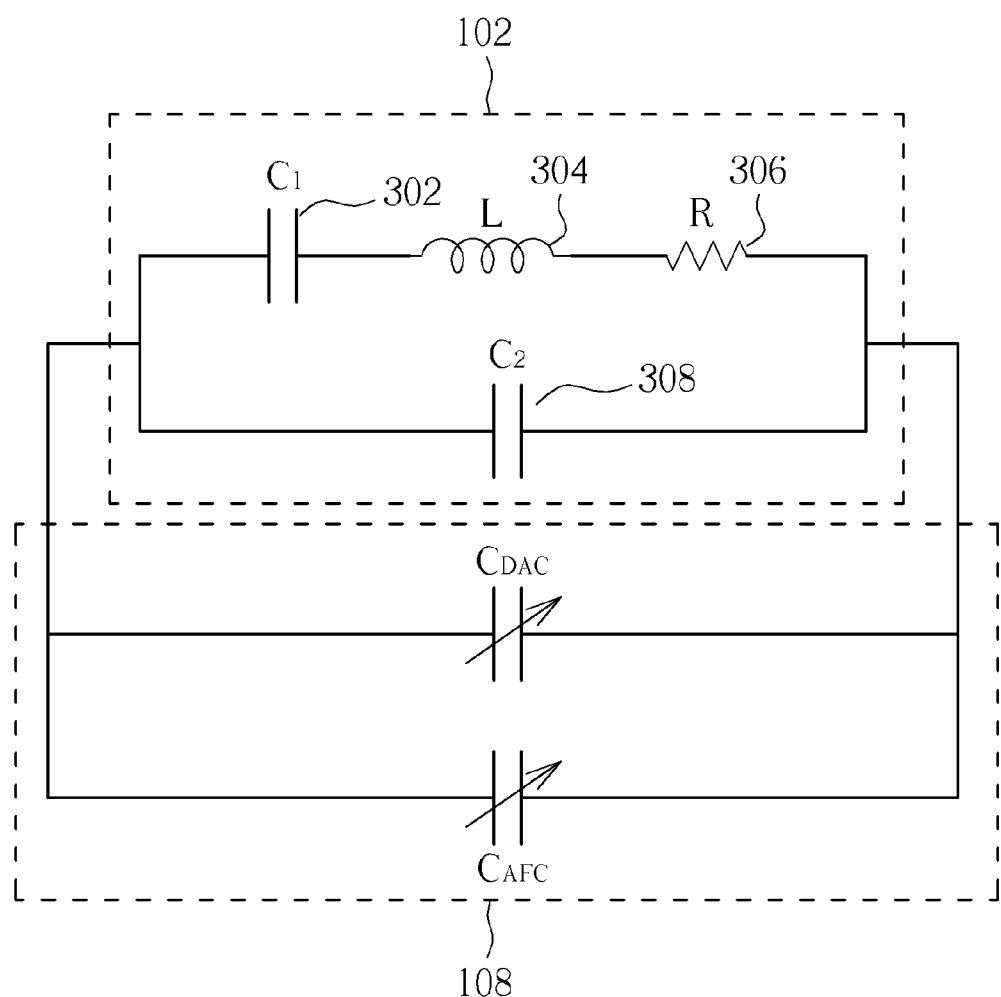
FIG. 3 is a schematic diagram of an equivalent circuit of a crystal and a tuning block of the clock generator shown in FIG. 2 according to an embodiment of the present invention.

In more detail, please refer to FIG. 3, which is a schematic diagram of an equivalent circuit of the crystal 102 and the tuning block 108. As shown in FIG. 3, at resonant frequency the crystal 102 is equivalent to an L-R-C circuit including an inductor L 304, a resistor R 306, and capacitors $C_1$ 302, $C_2$ 308. The tuning block 108 is connected in parallel to the crystal 102, and it may be shown that the oscillation frequency f_OSC of the crystal 102 can be expressed as $$\text{f\_OSC} = \frac{1}{2\pi} \sqrt{\left(\frac{1}{L \times C_1}\right) + \left(\frac{1}{L \times Ceq}\right)} \quad \text{(Eqn. 1)}$$

wherein L is the inductance value of the inductor 304, and Ceq is the total equivalent capacitance of the capacitor 308, and the variable capacitor arrays $C_{DAC}$ and $C_{AFC}$ of the tuning block 108. Since the variable capacitor arrays $C_{DAC}$ and $C_{AFC}$ may be adjusted according to the standby signal STB, the standby signal STB may control the oscillation frequency of the crystal 102. The capacitor arrays $C_{DAC}$ and $C_{AFC}$ may be used for coarse tuning and fine tuning of the crystal 102, respectively. Referring back to FIG. 2, power consumed by the amplifier block 104 is predominantly determined by the transconductance value Gm of the NMOS transistor N1. During the full-power mode FPM, the transconductance value Gm is set to be the higher transconducatance value Gm_FPM, and during the low-power mode LPM, the Gm is set to be the lower transconducatance value Gm_LPM. However, it is known in the art that the oscillation of the crystal 102 depends on an oscillation criteria:

$$\frac{Gm}{(Ceq)^2} > K \qquad \text{(Eqn. 2)}$$

wherein K is a threshold value in order for oscillation to occur. In other words, in order for oscillation to occur, the transconductance Gm and the equivalent total capacitance Ceq must be kept within a specific ratio. Thus, when the transconductance Gm is reduced to lower power consumption during the low-power mode LPM, the equivalent total capacitance Ceq also needs to be reduced to maintain the oscillation criteria. This can be achieved by lowering the capacitance values of the variable capacitor arrays, $C_{DAC}$ and $C_{AFC}$ in the tuning block 108. However, as can be seen from Eqn. 1, when the equivalent capacitance Ceq is lowered during the low-power mode LPM, this causes the oscillation signal SOSC to increase in frequency and cause the CLK_L to drift from a designated value. Since the CLK_L is used as the real-time clock and must be kept stable, the resulting frequency error may have severe consequences for mobile communications, as mentioned above. Thus, it is necessary to incorporate a frequency error compensation mechanism into the clock generator 10.

In one embodiment, the frequency division block 106 may be designed to have a different divisor during different power modes. For example, during the low-power mode LPM, when the mobile device enters standby, the divisor DIV may be set to a higher value DIV_LPM, to compensate for the increase in oscillation frequency of the crystal 102 during the low-power mode LPM. As such, the resulting CLK_L may be maintained equal as during the full-power mode FPM. On the other hand, during the full-power mode FPM, when the mobile device is active and requires a high-quality and high-frequency clock signal, the divisor DIV may be set to a lower value DIV_FPM, such that the resulting CLK_L may be maintained equal as during the low-power mode LPM.

Figure 4:
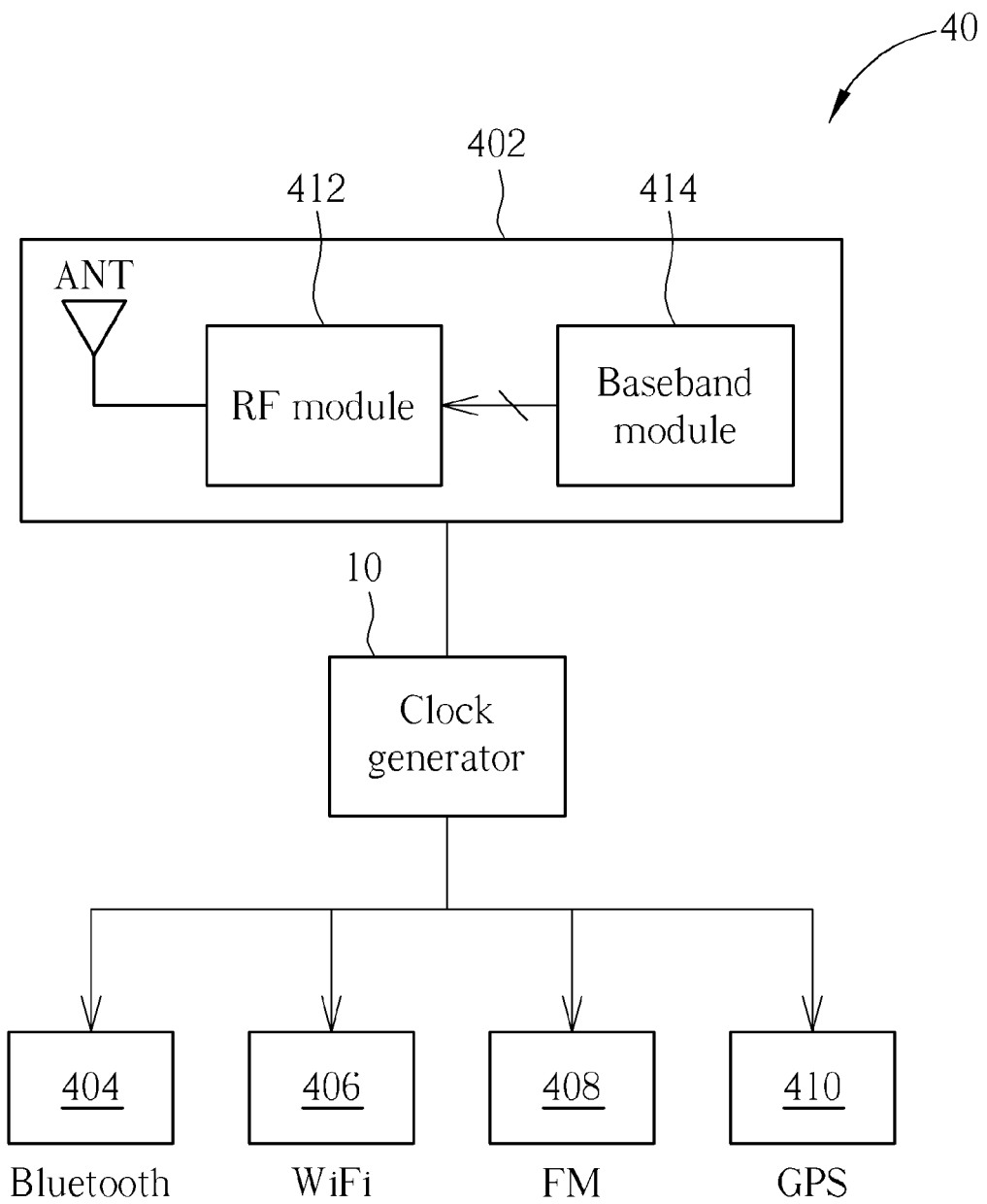
FIG. 4 is a schematic diagram of a mobile communications device according to an embodiment of the present invention.

The clock generator 10 can be used in a mobile device. Please refer to FIG. 4, which is a schematic block diagram of a mobile device 40 according to an embodiment of the present invention. The mobile device 40 includes the clock generator 10, and a plurality of wireless communications blocks 402-410. The mobile device 40 may be a notebook, a cellular phone, a portable gaming device, a portable multimedia player, a receiver, or other such product. The clock generator 10 may be used to provide different clock signals for the plurality of wireless communications blocks 402 to 410 to provide different wireless communications services, respectively. The wireless communications blocks 402 to 410 may communicate with corresponding apparatuses (e.g. base stations, access points, Bluetooth devices, and so on) using different protocols via the air interface. The wireless communications block 402, for example, includes an antenna ANT, an RF module 412 and a baseband module 414. The RF module 412 receives wireless RF signals via the air interface, and converts the received RF signals into baseband signals. The baseband signals are then processed by the baseband module 414. The clock generator 10 may provide the high frequency clock signal CLK_H for various communications operations of the RF module 412 and the baseband module 414, such as modulation/demodulation, encoding/decoding, and so on. Conventionally, a mobile processor requires two external crystal oscillators, one for supplying RF clock signals, and the other for standby mode and battery-off clock. In comparison, the mobile device 40 only requires a single crystal oscillator (the clock generator 10). The production cost of on-chip oscillators are negligible (e.g. less than 0.001 USD) compared to crystal oscillators (e.g. 0.1-0.15 USD). Thus, the mobile device 40 can have a much lower production cost.

Figure 5:
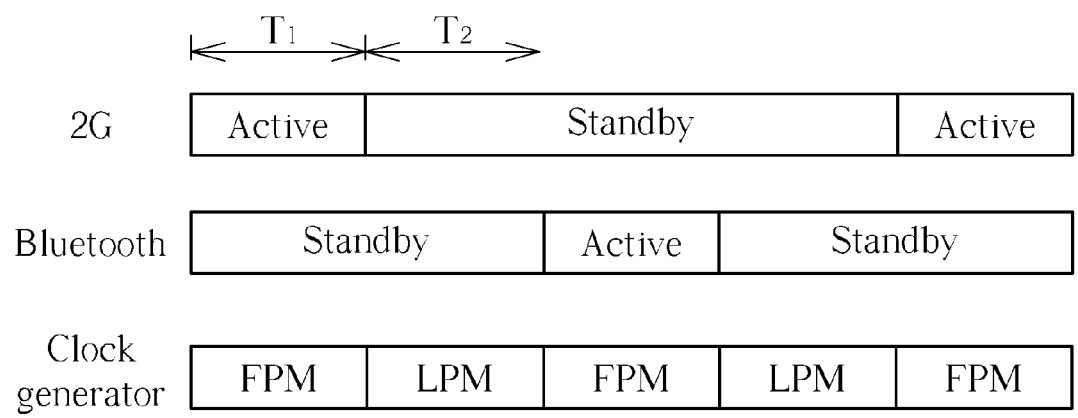
FIG. 5 is a timing diagram of operations of the mobile communications device shown in FIG. 4 according to an embodiment of the present invention.

Please refer to FIG. 5, which is a timing diagram of operation of different communications blocks of the mobile device 40. When any of the communications blocks is active, the clock generator 10 operates in the full-power mode FPM to provide different frequencies for each communications block according to system needs, e.g. Bluetooth, 2G system, etc. For example, during a time period T1, the 2G system is active and Bluetooth is in standby. Therefore, the clock generator 10 operates in the full-power mode FPM to generate the high frequency clock signal CLK_H to provide radio frequency clock signals for the 2 G communications block. Meanwhile, the clock generator 10 continues to generate the low-frequency clock signal CLK_L for other inactive communication blocks (e.g. the Bluetooth system). On the other hand, during a time period T2, none of the communications blocks in the mobile device 40 are active. Thus, the clock generator 10 may operate in the low power mode LPM, and only generate the low-frequency clock signal CLK_L for the communications blocks.

Notably, the spirit of the present invention is to utilize a single-crystal oscillator in the clock generator, and generate different clocks via frequency division and different power modes. However, variations and modifications may be suitably made by those skilled in the art. For example, the oscillator does not have to be a digitally controller crystal oscillator (DCXO) but may also be other kinds of oscillators. Also, the oscillator may be externally connected to the clock generator. The type of frequency divider is also not limited, as long as the divisor of the frequency divider can be adjusted to achieve frequency error compensation and maintain the low frequency clock to be equal during different power modes.

In the prior art, a mobile communications device requires multiple external crystal oscillators to provide reference clocks for different functional blocks of the device, thus increasing production costs and circuit area. In comparison, the present invention utilizes a single crystal oscillator in a clock generator that can operate in different power modes to generate multiple clock signals that can be used for different communication blocks in a mobile device during active or standby. Thus, production costs and circuit area may be effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator for a mobile device, capable of operating in one of a full-power mode and a low-power mode according to a standby signal to generate a high-frequency clock signal and a low-frequency clock signal, the clock generator comprising:

a crystal oscillator, for generating an oscillation signal of a specific frequency according to a power mode of the clock generator;

a frequency division block, for dividing the oscillation signal by a specific divisor according to the power mode of the clock generator to generate the low-frequency clock signal; and a buffer block, for amplifying the oscillation signal to generate the high-frequency clock signal;

wherein during each of the full-power mode and the low-power mode, a frequency of the low-frequency clock signal is substantially the same.

2. The clock generator of claim 1, wherein the crystal oscillator generates an oscillation signal of a frequency according to the power mode of the clock generator, the frequency division block divides the oscillation signal by a divisor to generate a frequency-divided oscillation signal as the low-frequency clock signal, and the buffer block amplifies the oscillation signal to generate the high-frequency clock signal.

3. The clock generator of claim 1, wherein a first frequency of a first oscillation signal of the crystal oscillator during the low-power mode is adjusted to be higher than a second frequency of a second oscillation signal of the crystal oscillator during the full-power mode.

4. The clock generator of claim 1, wherein a first power consumed by the crystal oscillator during the low-power mode is adjusted to be lower than a second power consumed by the crystal oscillator during the full-power mode.

5. The clock generator of claim 1, wherein a first divisor of the frequency division block during the low-power mode is adjusted to be higher than a second divisor of the frequency division block during the full-power mode.

6. The clock generator of claim 1, wherein the crystal oscillator comprises:
a crystal, for generating the oscillation signal;
a tuning block, coupled to the crystal, for adjusting the specific frequency of the oscillation signal according to the power mode of the clock generator, comprising a plurality of variable capacitor arrays, having a specific equivalent capacitance value according to the power mode of the clock generator; and
an amplifier block, for driving the crystal.

7. The clock generator of claim 6, wherein the frequency of the oscillation signal corresponds to the equivalent capacitance value.

8. The clock generator of claim 6, wherein the amplifier block comprises:
an NMOS transistor, for driving the crystal with a transconductance value and sustaining the oscillation signal;
a resistor, for providing the bias for the NMOS transistor; and
a current source, for providing a current to the NMOS transistor;
wherein the transconductance value corresponds to the power mode of the clock generator.

9. The clock generator of claim 1, wherein the frequency division block comprises a sigma-delta modulation fractional-n divider, and n is the specific divisor according to the standby signal.

10. The clock generator of claim 1, wherein the low-frequency clock signal is a real-time clock (RTC) signal.

11. A mobile device, comprising:
a clock generator, capable of operating in one of a full-power mode and a low-power mode according to a standby signal to generate a high-frequency clock signal and a low-frequency clock signal, the clock generator comprising:
a crystal oscillator, for generating an oscillation signal of a specific frequency according to a power mode of the clock generator;
a frequency division block, for dividing the oscillation signal by a specific divisor according to the power mode of the clock generator to generate the low-frequency clock signal; and
a buffer block, for amplifying the oscillation signal to generate the high-frequency clock signal; and
wherein during each of the full-power mode and the low-power mode, a frequency of the low-frequency clock signal is substantially the same.

12. The mobile device of claim 11, wherein the crystal generates an oscillation signal of a frequency, the frequency division block divides the oscillation signal by a divisor to generate a frequency-divided oscillation signal as the low-frequency clock signal, and the buffer block amplifies the oscillation signal to generate the high-frequency clock signal.

13. The mobile device of claim 11, wherein a first frequency of a first oscillation signal of the crystal oscillator during the low-power mode is adjusted to be higher than a second frequency of a second oscillation signal of the crystal oscillator during the full-power mode.

14. The mobile device of claim 11, wherein a first power consumed by the crystal oscillator during the low-power mode is adjusted to be lower than a second power consumed by the crystal oscillator during the full-power mode.

15. The mobile device of claim 11, wherein a first divisor of the frequency division block during the low-power mode is adjusted to be higher than a second divisor of the frequency division block during the full-power mode.

16. The mobile device of claim 11, wherein the crystal oscillator comprises:
a crystal, for generating the oscillation signal;
a tuning block, coupled to the crystal, for adjusting the specific frequency of the oscillation signal according to the power mode of the clock generator, comprising a plurality of variable capacitor arrays, having a specific equivalent capacitance value according to the power mode of the clock generator; and
an amplifier block, for driving the crystal.

17. The mobile device of claim 16, wherein the frequency of the oscillation signal corresponds to the equivalent capacitance value.

18. The mobile device of claim 16, wherein the amplifier block comprises:
an NMOS transistor, for driving the crystal with a transconductance value and sustaining the oscillation signal;
a resistor, for providing the bias for the NMOS transistor; and
a current source, for providing a current to the NMOS transistor;
wherein the transconductance value corresponds to the power mode of the clock generator.

19. The mobile device of claim 11, wherein the frequency division block comprises a sigma-delta modulation fractional-n divider, and n is the specific divisor according to the standby signal.

20. The mobile device of claim 11, wherein the low-frequency clock signal is a real-time clock (RTC) signal.

* * * * *